(12) United States Patent
Hamana et al.

(10) Patent No.: US 9,299,530 B2
(45) Date of Patent: Mar. 29, 2016

(54) ELECTRON TUBE

(71) Applicant: HAMAMATSU PHOTONICS K.K., Hamamatsu-shi, Shizuoka (JP)

(72) Inventors: Yasumasa Hamana, Hamamatsu (JP); Takaaki Nagata, Hamamatsu (JP); Kimitsugu Nakamura, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/425,917

(22) PCT Filed: Jul. 31, 2013

(86) PCT No.: PCT/JP2013/070735
§ 371 (c)(1),
(2) Date: Mar. 4, 2015

(87) PCT Pub. No.: WO2014/038317
PCT Pub. Date: Mar. 13, 2014

(65) Prior Publication Data
US 2015/0228439 A1 Aug. 13, 2015

(30) Foreign Application Priority Data

Sep. 5, 2012 (JP) ................................ 2012-195215

(51) Int. Cl.
*H01J 31/50* (2006.01)
*H01J 29/86* (2006.01)
(Continued)

(52) U.S. Cl.
CPC . *H01J 29/86* (2013.01); *H01J 5/08* (2013.01); *H01J 5/10* (2013.01); *H01J 29/88* (2013.01); *H01J 31/50* (2013.01); *H01J 40/18* (2013.01)

(58) Field of Classification Search
CPC ............... H01J 5/08; H01J 5/10; H01J 29/88; H01J 31/50
USPC .................................................. 313/525, 479
See application file for complete search history.

(56) References Cited

U.S. PATENT DOCUMENTS 4,604,545 A 8/1986 McDonie et al.

FOREIGN PATENT DOCUMENTS

JP S50-112053 U 2/1974
JP H51-131263 A 11/1976
(Continued)

OTHER PUBLICATIONS

U.S. Appl. No. 14/425,810, Hamamatsu Photonics K.K.
(Continued)

*Primary Examiner* — Vip Patel
(74) *Attorney, Agent, or Firm* — Drinker Biddle & Reath LLP

(57) ABSTRACT

In an electron tube, an atomic layer deposition method is used to form an electrical resistance film having a stacked structure of electrically insulating layers and electrically conductive layers or a mixed structure of an electrically insulating material and an electrically conductive material, so as to cover the whole of an inner wall surface and an outer wall surface of a second envelope. By use of the atomic layer deposition method, the firm and fine electrical resistance film with a desired resistance can be formed on an insulation surface, without containing a material such as a binder. When the electrical resistance film is provided with slight electrical conductivity, it can suppress occurrence of withstand voltage failure due to electrification of the insulation surface or the like and realize stability of withstand voltage characteristics.

12 Claims, 3 Drawing Sheets

(51) Int. Cl.
*H01J 5/10* (2006.01)
*H01J 29/88* (2006.01)
*H01J 5/08* (2006.01)
*H01J 40/18* (2006.01)

(56) References Cited

FOREIGN PATENT DOCUMENTS

| JP | S58-005319 Y2 | 1/1983 |
| JP | H02-227946 A | 9/1990 |
| JP | H09-265923 A | 10/1997 |
| JP | 2002-080828 A | 3/2002 |
| JP | 2003-226970 A | 8/2003 |
| JP | 2010-199449 A | 9/2010 |
| JP | 2010-267414 A | 11/2010 |
| JP | 2011-501877 A | 1/2011 |
| JP | 2011-082301 A | 4/2011 |
| JP | 2012-094660 A | 5/2012 |

OTHER PUBLICATIONS

English-language translation of International Preliminary Report on Patentability (IPRP) dated Mar. 19, 2015 that issued in WO Patent Application No. PCT/JP2013/070735.

English-language translation of International Preliminary Report on Patentability (IPRP) dated Mar. 19, 2015 that issued in WO Patent Application No. PCT/JP2013/070736.

ELECTRON TUBE

TECHNICAL FIELD

The present invention relates to an electron tube.

BACKGROUND ART

For the electron tubes such as image intensifiers, there has been heretofore a need for a technology to prevent degradation of withstand voltage characteristics. The reason for it is that the degradation of withstand voltage characteristics of the electron tube would lead to a local discharging phenomenon and in turn to degradation of output characteristics of the electron tube. For suppressing this discharging phenomenon, for example, the electron tube described in Patent Literature 1 adopts a structure in which a part of an envelope is covered by a chromium oxide layer. Furthermore, for example in the electron tubes described in Patent Literatures 2 and 3, an electrically insulating film comprised of $Al_2O_3$, ZnO, and others is formed on an inner wall surface of a metal housing or on a neck portion of a glass housing.

CITATION LIST

Patent Literatures

Patent Literature 1: Japanese Unexamined Patent Application Publication No. Hei 2-227946
Patent Literature 2: Japanese Unexamined Patent Application Publication No. Hei 9-265923
Patent Literature 3: Japanese Unexamined Patent Application Publication No. 2002-80828

SUMMARY OF INVENTION

Technical Problem

In all of the above-described conventional technologies, a material is attached by application or the like and thereafter fired to form the electrically insulating film. For this reason, there were cases where an unwanted substance (e.g., binder) existed in the electrically insulating film so as to be heterogeneous in the film because of its manufacturing step, failing to achieve a desired resistance.

The present invention has been accomplished in order to solve the above problem and it is an object of the present invention to provide an electron tube capable of stably maintaining the withstand voltage characteristics.

Solution to Problem

In order to solve the above problem, an electron tube according to the present invention comprises a cylindrical housing in which an insulation surface with an electrical insulation property is located on the inside; and an electrical resistance film covering the insulation surface, wherein the electrical resistance film has a stacked structure of an electrically insulating layer and an electrically conductive layer formed by an atomic layer deposition method.

In this electron tube, the atomic layer deposition method is used to form the electrical resistance film having the stacked structure of the electrically insulating layer and the electrically conductive layer. This allows the firm and fine electrical resistance film with a desired resistance to be formed on the insulation surface, without containing a material such as a binder, thereby suppressing the occurrence of withstand voltage failure due to electrification of the insulation surface or the like and realizing stabilization of the withstand voltage characteristics.

Another electron tube according to the present invention comprises a cylindrical housing in which an insulation surface with an electrical insulation property is located on the inside; and an electrical resistance film covering the insulation surface, wherein the electrical resistance film has a mixed structure of an electrically insulating material and an electrically conductive material formed by an atomic layer deposition method.

In this electron tube, the atomic layer deposition method is used to form the electrical resistance film having the mixed structure of the electrically insulating material and the electrically conductive material. This allows the firm and fine electrical resistance film with a desired resistance to be formed on the insulation surface, without containing a material such as a binder, thereby suppressing the occurrence of withstand voltage failure due to electrification of the insulation surface or the like and realizing stabilization of the withstand voltage characteristics.

Preferably, the electrical resistance film is formed across a substantially entire area of the insulation surface. This makes it feasible to more definitely suppress the occurrence of withstand voltage failure.

Preferably, on the inside of the housing, an electrical conduction surface with an electrical conduction property is located so as to be continuous to the insulation surface, and the electrical resistance film is formed across a range from the insulation surface to the electrical conduction surface. A boundary portion between the insulation surface and the electrical conduction surface in the housing is a triple junction of the insulating material, the electrically conductive material, and vacuum, and is a portion where discharging is particularly likely to occur. Therefore, by forming the electrical resistance film across the range from the insulation surface to the electrical conduction surface, it is feasible to effectively prevent the occurrence of discharging.

Preferably, the electrical resistance film is formed across a substantially entire area of the insulation surface and the electrical conduction surface. This homogenizes electrical characteristics of the inner wall surface of the housing, whereby it is feasible to more definitely suppress the occurrence of withstand voltage failure.

Preferably, the electron tube further comprises: an electrode arranged inside the housing; and an energization portion penetrating the housing to be electrically connected to the electrode; the electrical resistance film is formed on a contact portion between the energization portion and an inner surface of the housing. By covering the energization portion likely to be electrically unstable, by the electrical resistance film, it is feasible to more definitely suppress the occurrence of withstand voltage failure.

Preferably, the electron tube further comprises: a photocathode for converting incident light into photoelectrons; and a phosphor screen for receiving the photoelectrons generated in the photocathode, to generate fluorescence. In the electron tube with the photocathode and the phosphor screen, for example, like the image intensifier, occurrence of the discharging phenomenon in the housing is likely to affect the output characteristics. Therefore, it is particularly useful to suppress the occurrence of withstand voltage failure by forming the aforementioned electrical resistance film on the insulation surface.

Advantageous Effect of Invention

According to the present invention, the withstand voltage characteristics can be maintained on a stable basis.

DESCRIPTION OF EMBODIMENTS

A preferred embodiment of the electron tube according to the present invention will be described below in detail with reference to the drawings.

Figure 1:
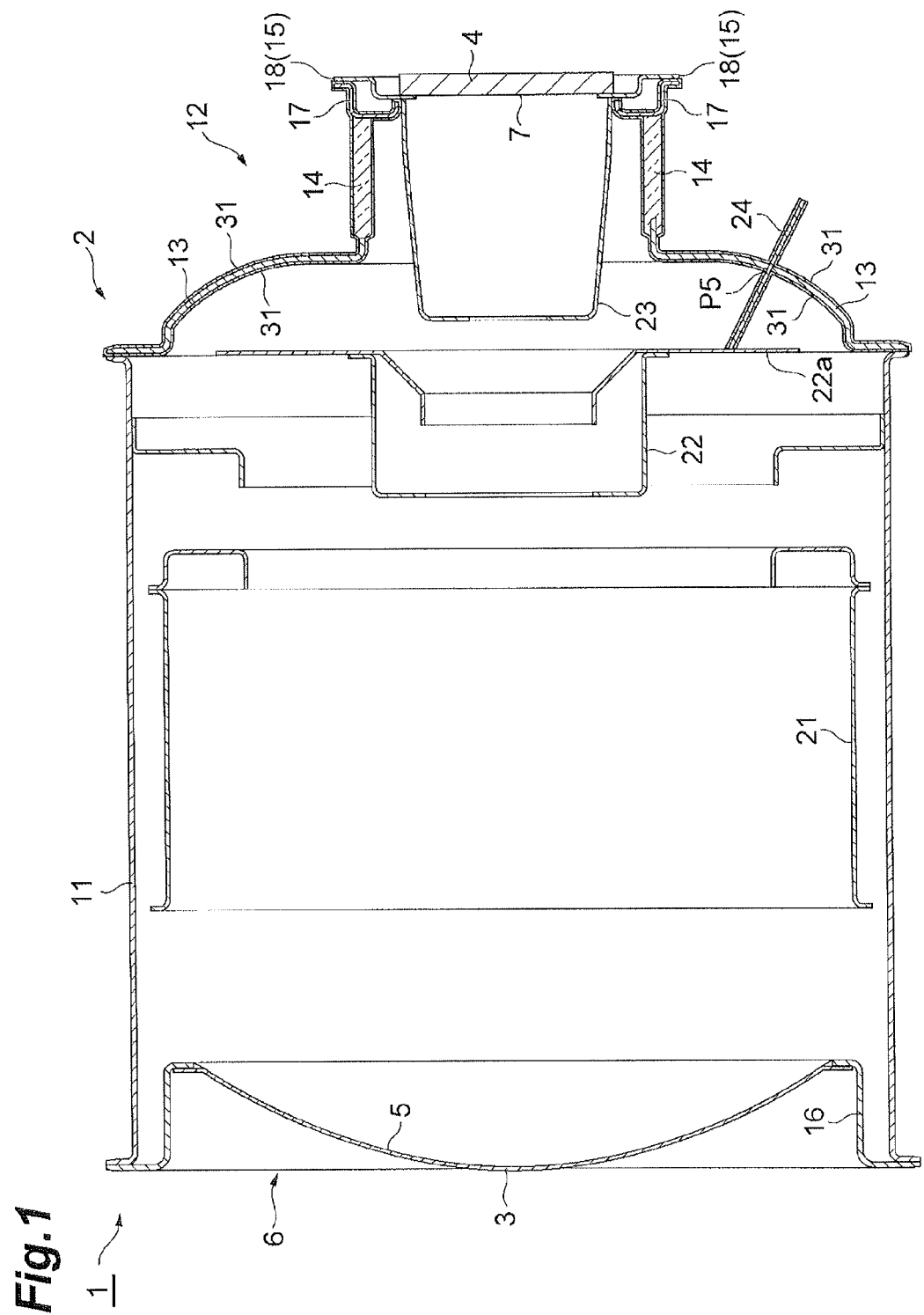
FIG. 1 is a cross-sectional view showing an internal configuration of an electron tube according to an embodiment of the present invention.

FIG. 1 is a cross-sectional view showing an internal configuration of an electron tube according to an embodiment of the present invention. As shown in the same drawing, the electron tube 1 is an X-ray image intensifier in which a photoelectron surface (cathode) 5, a first grid electrode 21, a second grid electrode 22, an anode 23, and a phosphor screen 7 are arranged in proximity inside a housing 2 including a first envelope 11 and a second envelope 12 described below.

The inside of the electron tube 1 is held in a high vacuum state while the two opening ends of the housing 2 of a substantially cylindrical shape opening at the two ends are hermetically sealed by an input window 3 and an output window 4 of a substantially circular disk shape. Namely, the housing 2, input window 3, and output window 4 constitute a vacuum vessel. The photoelectron surface 5 is formed in a substantially central portion of the vacuum-side surface of the input window 3. A photocathode 6 for converting X-rays into photoelectrons is constituted by these input window 3 and the photoelectron surface 5 and by a scintillator (not shown) for converting X-rays into visible light, which is provided between the input window 3 and the photoelectron surface 5. On the other hand, the phosphor screen 7 is formed in a substantially central portion of the vacuum-side surface of the output window 4. The phosphor screen 7 is formed, for example, by applying a fluorescent material onto the vacuum-side surface of a glass face plate comprised of synthetic silica or the like. A light image output from the phosphor screen 7 is acquired generally by an imaging device such as a CCD camera.

The housing 2 has a first envelope 11 of a substantially cylindrical shape comprised of an electrically conductive material, e.g., stainless steel, a second envelope 12 of a tubular shape made by combining an electrically conductive material and an insulating material, and a third envelope 15 of a ring shape comprised of an electrically conductive material. The second envelope 12 is composed of a metal envelope 13 of a substantially circular disk shape, for example, comprised of Kovar metal, an insulating envelope 14 of a substantially cylindrical shape, for example, comprised of Kovar glass, and a ring member 17, for example, comprised of Kovar metal. The third envelope 15 is composed of a ring member 18, for example, comprised of Kovar metal.

At one end of the first envelope 11, the aforementioned input window 3 is fit thereto through a flange member 16 comprised of an electrically conductive material, and at the other end of the first envelope 11, one end of the metal envelope 13 is fixed thereto. Therefore, the flange member 16, the first envelope 11, and the metal envelope 13 are equipotential (at the cathode potential) with the photoelectron surface 5. The other end side of the metal envelope 13 is constricted into a diameter smaller than that of the one end side, and one end of the insulating envelope 14 is fixed to the other end side of the metal envelope 13. Furthermore, one end of the ring member 17 is fixed to the other end side of the insulating envelope 14 and one end of the ring member 18 is fixed to the other end side of the ring member 17. Therefore, the housing 2 can keep the first envelope 11 and the metal envelope 13 at the potential different from that of the ring members 17, 18 through the insulating envelope 14.

Arranged inside the first envelope 11 are the first grid electrode 21 and the second grid electrode 22 which form an electric field in collaboration with the anode 23 and which accelerate and converge photoelectrons generated in the photocathode 6, toward the phosphor screen 7. The anode 23 and the output window 4 are arranged inside the second envelope 12 and the third envelope. The anode 23 and the output window 4 are fixed to the ring member 18 and the ring member 18 is at the anode potential. Furthermore, the ring member 17 and the ring member 18 are joined, for example, by welding or the like to be electrically connected to each other. Therefore, the second envelope 12 has the configuration wherein the metal envelop 13 at the cathode potential and the ring member 17 at the anode potential are integrated through the insulating envelope 14.

A predetermined voltage is applied from an external power supply (not shown) to the photoelectron surface 5 and the phosphor screen 7. The metal envelope 13 is provided with a power supply pin (energization portion) 24 to be used for power supply to the first grid electrode 21 and the second grid electrode 22. The power supply pin 24 is fixed through an unshown insulator while electrically isolated from the metal envelope 13. This power supply pin 24 extends through the metal envelope 13 into the interior of the housing 2 and is connected to a flange portion 22a of the second grid electrode 22 inside the first envelope 11. For example, the voltage of several hundred V is applied to the grid electrode 21, the voltage of 20 kV to the grid electrode 22, and the voltage of 25 kV to the anode 23.

Figure 2:
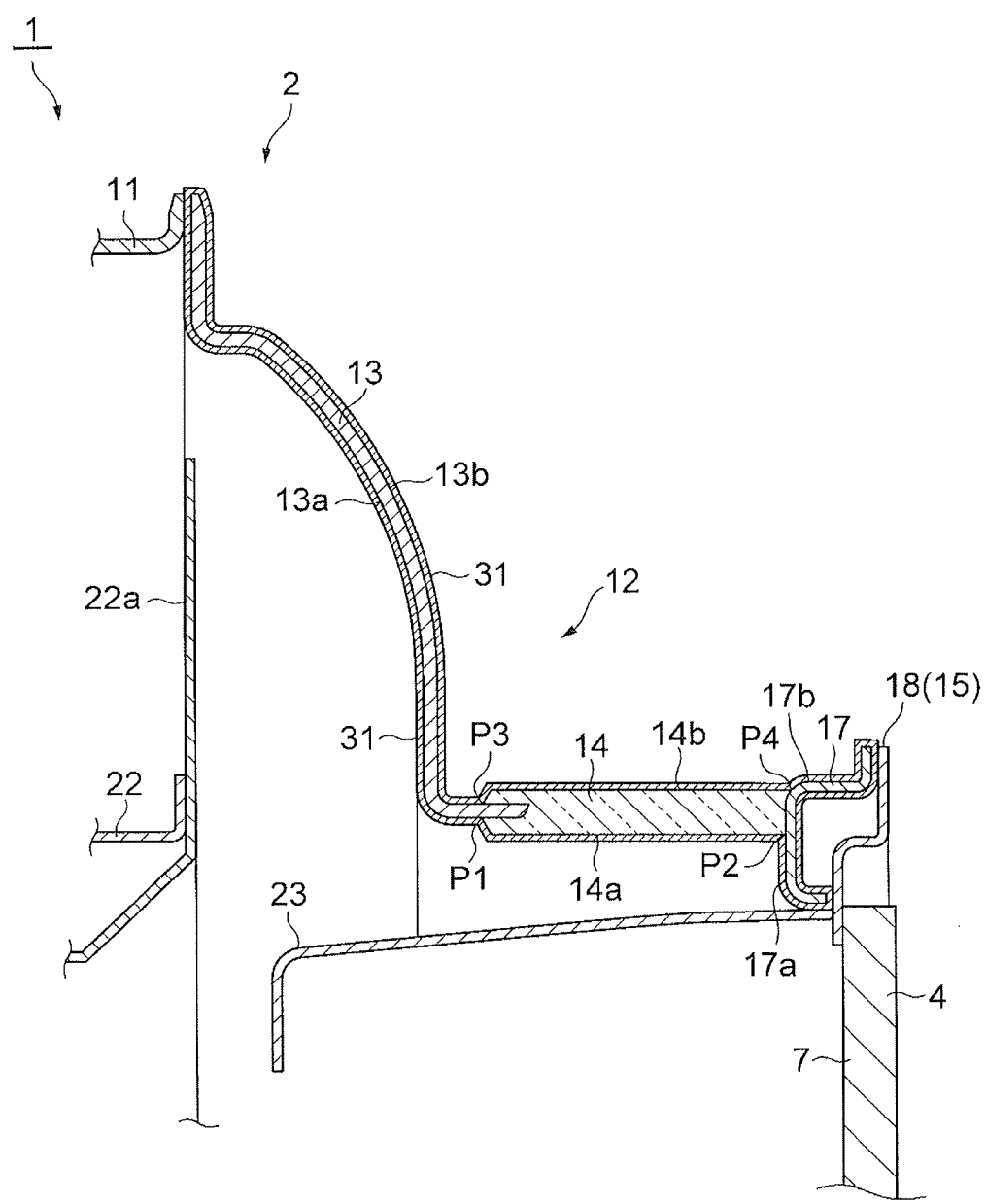
FIG. 2 is an enlarged cross-sectional view of a major part of the electron tube shown in FIG. 1.

In this configuration, an electrical resistance film 31 is formed, as shown in FIG. 2, on wall surfaces of the second envelope 12. In the present embodiment, the electrical resistance film 31 covers the whole of the inner wall surface and outer wall surface of the second envelope 12. Namely, in the second envelope 12, the electrical resistance film 31 is formed across a range from the inner wall surface (electrical conduction surface) 13a of the metal envelope 13, through a boundary portion P1 between the metal envelope 13 and the insulating envelope 14, an inner wall surface (insulation surface) 14a of the insulating envelope 14, and a boundary portion P2 between the insulating envelope 14 and the ring member 17, to an inner wall surface (electrical conduction surface) 17a of the ring member 17.

Furthermore, in the second envelope 12, the electrical resistance film 31 is formed across a range from an outer wall surface 13b of the metal envelope 13, through a boundary portion P3 between the metal envelope 13 and the insulating envelope 14, an outer wall surface 14b of the insulating envelope 14, and a boundary portion P4 between the insulating envelope 14 and the ring member 17, to an outer wall surface 17b of the ring member 17. Since the electrical resistance film 31 covers the inner wall surface and outer wall surface of the second envelope 12, it is also formed on a contact portion P5 between the power supply pin 24 penetrating the metal envelope 13 and the inner wall surface 13a of the metal envelope 13, as shown in FIG. 1. The electrical resistance film 31 is also formed over the entire exterior surface of the power supply pin 24 so as to be continuous to the contact portion P5.

This electrical resistance film 31 is formed by the atomic layer deposition method (ALD: Atomic Layer Deposition). The atomic layer deposition method is a technique of repetitively carrying out an adsorption step of molecules of a compound, a film formation step by reaction, and a purge step of removing excess molecules, thereby to stack atomic layers one by one, so as to obtain a thin film.

Film formation cycles of the electrical resistance film 31 by use of the atomic layer deposition method include film formation cycles of an electrically insulating material and film formation cycles of an electrically conductive material. For example, in a case where the electrically insulating material is $Al_2O_3$ and the electrically conductive material is ZnO, a film formation cycle of $Al_2O_3$ includes, for example, an adsorption step of $H_2O$, a purge step of $H_2O$, an adsorption step of trimethyl aluminum, and a purge step of trimethyl aluminum carried out in this order. Furthermore, a film formation cycle of ZnO includes an adsorption step of $H_2O$, a purge step of $H_2O$, an adsorption step of diethyl zinc, and a purge step of diethyl zinc carried out in this order. The film formation cycles of $Al_2O_3$ and the film formation cycles of ZnO are repetitively executed approximately sixty times, for example, at an execution ratio of 4:1 (a ratio to execute four film formation cycles of $Al_2O_3$ and thereafter execute one film formation cycle of ZnO), thereby obtaining the electrical resistance film 31 in the thickness of about 300 Å.

The electrical resistance film 31 formed by the atomic layer deposition method usually has a stacked structure of $Al_2O_3$ layers (electrically insulating layers) and ZnO layers (electrically conductive layers), but it does not always have the stacked structure because of influence of heating or the like conducted in the whole manufacturing process of the electron tube 1; instead, it can have a mixed structure of $Al_2O_3$ (electrically insulating material) and ZnO (electrically conductive material) in some cases.

In the electron tube 1, as described above, the atomic layer deposition method is used to form the electrical resistance film 31 having the stacked structure of the electrically insulating layers and electrically conductive layers or the mixed structure of the electrically insulating material and the electrically conductive material, so as to cover the whole of the inner wall surface and outer wall surface of the second envelope 12. By use of the atomic layer deposition method, the firm and fine electrical resistance film 31 with a desired resistance can be formed on the inner wall surface 14a of the insulating envelope 14, without containing a material such as a binder. As the electrical resistance film 31 is provided with slight electrical conductivity, it can suppress the occurrence of withstand voltage failure due to electrification of the inner wall surface 14a or the like. Therefore, it is feasible to suppress discharging or emission of light in the housing 2.

Since the problem of absorption of alkali is less likely to arise, different from the case where the electrical resistance film is formed by application or the like, the photoelectron surface 5 and others can be produced without use of a large amount of alkali, which can inhibit degradation of noise characteristics. Furthermore, since the electrical resistance film 31 can be formed firmly and finely on the inner wall surface 14a, occurrence of delamination can be suppressed compared to the case where the electrical resistance film is formed by application or the like. If delamination occurs, it can produce foreign matter in the housing 2 to cause image failure or the like. In the electron tube 1, therefore, occurrence of such image failure can also be prevented. When the electrical resistance film is formed by application or the like, there are problems of increase in man-hours and time necessary for evacuation of gas adsorbing to film; in contrast, the electron tube 1 can circumvent these problems.

In the electron tube 1, in the second envelope 12 the electrical resistance film 31 is formed across the range from the inner wall surface 13a of the metal envelope 13, through the boundary portion P1 between the metal envelope 13 and the insulating envelope 14, the inner wall surface 14a of the insulating envelope 14, and the boundary portion P2 between the insulating envelope 14 and the ring member 17, to the inner wall surface 17a of the ring member 17. This homogenizes the electrical characteristics of the inner wall surface of the housing 2, whereby the occurrence of withstand voltage failure can be more definitely suppressed. Particularly, the boundary portions P1, P2 between insulation surface and electrical conduction surface are triple junctions of the insulating material, the electrically conductive material, and vacuum in the housing 2, which are portions where discharging is particularly likely to occur. Therefore, by forming the electrical resistance film 31 so as to cover the boundary portion P1 between the metal envelope 13 and the insulating envelop 14 and the boundary portion P2 between the insulating envelope 14 and the ring member 17, it is feasible to effectively prevent the occurrence of discharging and emission of light.

Furthermore, in the electron tube 1, the electrical resistance film 31 is also formed on the contact portion P5 between the power supply pin 24 penetrating the metal envelope 13 and the inner wall surface 13a of the metal envelop 13. When the electrical resistance film 31 covers the contact portion P5 between the power supply pin 24 and the metal envelope 13 which is likely to become electrically unstable, the occurrence of withstand voltage failure can be more definitely suppressed.

Figure 3:
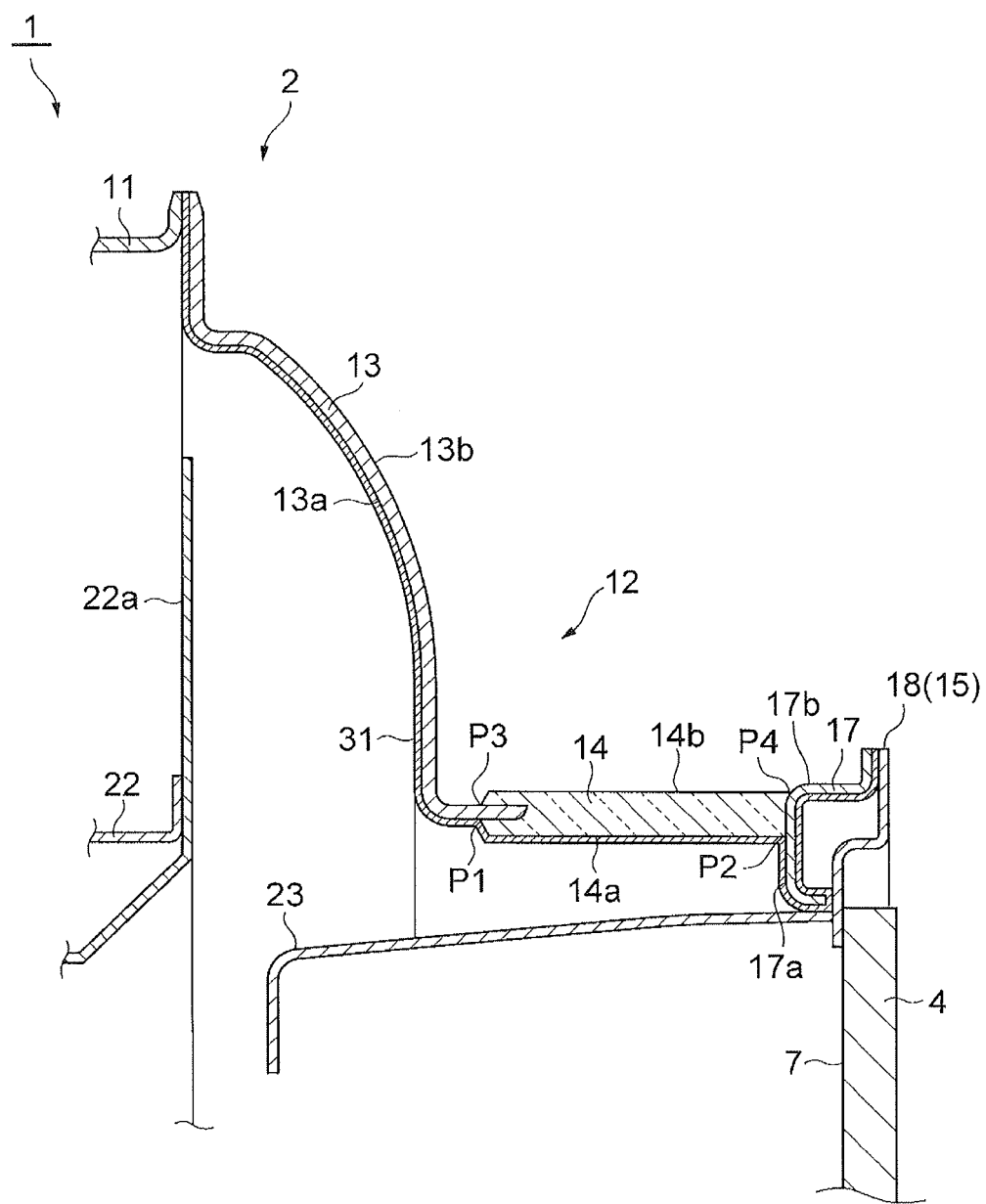
FIG. 3 is an enlarged cross-sectional view of a major part of an electron tube according to a modification example.

The present invention is not limited to the above embodiment. For example, the aforementioned embodiment showed the X-ray image intensifier as the electron tube 1 by way of illustration, but the electrical resistance film 31 can also be applied to the image intensifiers in other wavelength bands and to other electron tubes such as streak tubes, photomultipliers, electron multipliers, and X-ray tubes. In the foregoing embodiment, the electrical resistance film 31 is formed so as to cover the whole of the inner wall surface and outer wall surface of the second envelope 12, but the electrical resistance film 31 may be formed so as to cover only the inner wall surface of the second envelope 12, as shown in FIG. 3.

From the viewpoint of suppressing the occurrence of withstand voltage failure, the electrical resistance film 31 needs only to cover at least the inner wall surface 14a of the insulating envelope 14. Therefore, the electrical resistance film 31 may be formed so as to cover only the inner wall surface 14a of the insulating envelope 14, or may be formed across a range from the boundary portion P1 between the metal envelope 13 and the insulating envelope 14, through the inner wall surface 14a of the insulating envelope 14, to the boundary portion P2 between the insulating envelope 14 and the ring member 17. Furthermore, it may be formed beyond the boundary portions P1, P2 so as to further cover a middle portion of the inner wall surface 13a of the metal envelope 13 and a middle portion of the inner wall surface 17a of the ring member 17. In the above embodiment, ZnO was shown as the electrically conductive material to be used for formation of the electrical resistance film 31 by way of illustration, and examples of other electrically conductive materials applicable herein include $SnO_2$, $Ga_2O_3$, $In_2O_3$, NiO, CuO, $TiO_2$, $Cr_2O_3$, and so on. On the other hand, insulating materials applicable herein include MgO, $SiO_2$, $HfO_2$, and so on, as well as $Al_2O_3$ described above.

REFERENCE SIGNS LIST

1 electron tube; 2 housing; 6 photocathode; 7 phosphor screen; 13a inner wall surface (electrical conduction surface) of metal envelop; 14a inner wall surface (insulation surface) of insulating envelop; 17a inner wall surface (electrical conduction surface) of ring member (metal envelop); 21, 22 grid electrodes; 24 power supply pin (energization portion); 31 electrical resistance film; P5 contact portion.

The invention claimed is:

1. An electron tube comprising:
    a cylindrical housing in which an insulation surface with an electrical insulation property is located on the inside; and
    an electrical resistance film covering the insulation surface,
    wherein the electrical resistance film has a stacked structure of an electrically insulating layer and an electrically conductive layer formed by an atomic layer deposition method.

2. The electron tube according to claim 1, wherein the electrical resistance film is formed across a substantially entire area of the insulation surface.

3. The electron tube according to claim 1, wherein on the inside of the housing, an electrical conduction surface with an electrical conduction property is located so as to be continuous to the insulation surface, and
    wherein the electrical resistance film is formed across a range from the insulation surface to the electrical conduction surface.

4. The electron tube according to claim 3, wherein the electrical resistance film is formed across a substantially entire area of the insulation surface and the electrical conduction surface.

5. The electron tube according to claim 1, further comprising:
    an electrode arranged inside the housing; and
    an energization portion penetrating the housing to be electrically connected to the electrode,
    wherein the electrical resistance film is formed on a contact portion between the energization portion and an inner surface of the housing.

6. The electron tube according to claim 1, further comprising:
    a photocathode for converting incident light into photoelectrons; and
    a phosphor screen for receiving the photoelectrons generated in the photocathode, to generate fluorescence.

7. An electron tube comprising:
    a cylindrical housing in which an insulation surface with an electrical insulation property is located on the inside; and
    an electrical resistance film covering the insulation surface,
    wherein the electrical resistance film has a mixed structure of an electrically insulating material and an electrically conductive material formed by an atomic layer deposition method.

8. The electron tube according to claim 7, wherein the electrical resistance film is formed across a substantially entire area of the insulation surface.

9. The electron tube according to claim 7, wherein on the inside of the housing, an electrical conduction surface with an electrical conduction property is located so as to be continuous to the insulation surface, and
    wherein the electrical resistance film is formed across a range from the insulation surface to the electrical conduction surface.

10. The electron tube according to claim 9, wherein the electrical resistance film is formed across a substantially entire area of the insulation surface and the electrical conduction surface.

11. The electron tube according to claim 7, further comprising:
    an electrode arranged inside the housing; and
    an energization portion penetrating the housing to be electrically connected to the electrode,
    wherein the electrical resistance film is formed on a contact portion between the energization portion and an inner surface of the housing.

12. The electron tube according to claim 7, further comprising:
    a photocathode for converting incident light into photoelectrons; and
    a phosphor screen for receiving the photoelectrons generated in the photocathode, to generate fluorescence.

* * * * *